(12) United States Patent
Loopstra et al.

(10) Patent No.: US 6,509,951 B2
(45) Date of Patent: Jan. 21, 2003

(54) LITHOGRAPHIC PROJECTION APPARATUS HAVING A TEMPERATURE CONTROLLED HEAT SHIELD

(75) Inventors: Erik R. Loopstra, Heeze (NL); Yim Bun P. Kwan, Eindhoven (NL); Marcel J. E. H. Muitjens, Nuth (NL); Sonja T. De Vrieze-Voorn, Bakel (NL)

(73) Assignee: ASML Netherlands B.V., Veldhoven (NL)

( * ) Notice: Subject to any disclaimer, the term of this patent is extended or adjusted under 35 U.S.C. 154(b) by 19 days.

(21) Appl. No.: 09/777,697

(22) Filed: Feb. 7, 2001

(65) Prior Publication Data

US 2001/0013925 A1 Aug. 16, 2001

(30) Foreign Application Priority Data

Feb. 10, 2000 (EP) .............................. 00200432

(51) Int. Cl.$^7$ ..................... G03B 27/52; G03B 27/42
(52) U.S. Cl. ............................. 355/30; 355/53
(58) Field of Search ................. 355/30, 53; 310/12, 310/16; 250/443.1

(56) References Cited

U.S. PATENT DOCUMENTS

| | | | | |
|---|---|---|---|---|
| 4,989,031 A | * | 1/1991 | Kamiya | 355/30 |
| 5,063,582 A | * | 11/1991 | Mori et al. | 378/34 |
| 5,134,436 A | * | 7/1992 | Fujioka | 355/30 |
| 5,220,171 A | * | 6/1993 | Hara et al. | 250/443.1 |
| 5,577,552 A | * | 11/1996 | Ebinuma et al. | 165/101 |
| 5,864,386 A | * | 1/1999 | Nei | 355/30 |
| 5,877,843 A | * | 3/1999 | Takagi et al. | 355/30 |
| 6,226,073 B1 | * | 5/2001 | Emoto | 310/12 |

OTHER PUBLICATIONS

Thomas W. Novak, A New VLSI Printer, SPIE vol. 135 Developments in Semiconductor Microlithography III, 1978, 36–44.

* cited by examiner

*Primary Examiner*—Alan A. Mathews
(74) *Attorney, Agent, or Firm*—Pillsbury Winthrop LLP

(57) ABSTRACT

In a lithographic projection apparatus a first part is shielded from a second part by a heat shield. The first part is required to have a temperature of a predetermined value and the second part has a characteristic that may influence the temperature of the first part. The characteristic may be a temperature deviating from the predetermined value, or a supply of radiation that may deviate the temperature of the first part from the predetermined value when incident on the first part. Heat shield temperature controlling means are provided to control a temperature of the heat shield to the predetermined value.

20 Claims, 4 Drawing Sheets

LITHOGRAPHIC PROJECTION APPARATUS HAVING A TEMPERATURE CONTROLLED HEAT SHIELD

BACKGROUND OF THE INVENTION

1. Field of the Invention

The invention relates to a lithographic projection apparatus for imaging a mask pattern in a mask onto a substrate, said apparatus comprising:

- an illumination system constructed and arranged to supply a projection beam of radiation;
- a mask table provided with a mask holder constructed to hold a mask;
- a substrate table provided with a substrate holder constructed to hold a substrate; and
- a projection system constructed and arranged to image a portion of the mask onto a target portion of the substrate.

2. Background of the Related Art

A lithographic projection apparatus can be used, for example, in the manufacture of integrated circuits (ICs). In such a case, the mask (reticle) may contain a pattern corresponding to an individual layer of the IC, and this pattern can then be imaged onto a target portion (comprising one or more dies) on a substrate (silicon wafer) which has been coated with a layer of photosensitive material (resist). In general, a single wafer will contain a whole network of adjacent target portions which are successively irradiated through the mask, one at a time. In one type of lithographic projection apparatus, each target portion is irradiated by exposing the entire mask pattern onto the target portion at once; such an apparatus is commonly referred to as a waferstepper. In an alternative apparatus—which is commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally<1), the speed at which the substrate table is scanned will be a factor M times that at which the mask table is scanned. More information with regard to lithographic devices as here described can be gleaned from International Patent Application WO 97/33205.

Up to very recently, apparatus of this type contained a single mask table and a single substrate table. However, machines are now becoming available in which there are at least two independently movable substrate tables; see, for example, the multi-stage apparatus described in International Patent Applications WO 98/28665 and WO 98/40791. The basic operating principle behind such multi-stage apparatus is that, while a first substrate table is underneath the projection system so as to allow exposure of a first substrate located on that table, a second substrate table can run to a loading position, discharge an exposed substrate, pick up a new substrate, perform some initial alignment measurements on the new substrate, and then stand by to transfer this new substrate to the exposure position underneath the projection system as soon as exposure of the first substrate is completed, whence the cycle repeats itself; in this manner, it is possible to achieve a substantially increased machine throughput, which in turn improves the cost of ownership of the machine. The apparatus may also have more than one mask table and may comprise components which are operated in vacuum, and are correspondingly vacuum-compatible.

Lithographic apparatus may employ various types of projection radiation, such as ultraviolet light (UV), extreme UV (EUV), X-rays, ion beams or electron beams, for example. Depending on the type of radiation used and the particular design requirements of the apparatus, the projection system may be refractive, reflective or catadioptric, for example, and may comprise vitreous components, grazing-incidence mirrors, selective multi-layer coatings, magnetic and/or electrostatic field lenses, etc; for simplicity, such components may be referred to in this text, either singly or collectively, as a "lens".

SUMMARY OF THE INVENTION

There is a continuing desire in the semiconductor industry to be able to manufacture integrated circuits with ever higher component densities and hence smaller feature size. To be able to image smaller features, the temperature of various parts of the projection apparatus is required to be within a narrow range of a predetermined value. Deviations from the predetermined value would cause expansion or contraction of components, causing errors in the accurate positioning of, for instance, substrate and mask which is required in the projection of the features from the pattern in the mask onto the substrate. Temperature deviations from the said predetermined value may also cause errors in the readings of sensors that are used for, for instance, the positioning and/or leveling of the substrate. Such sensors may be sensitive to changes in the (temperature dependent) refractive index of a volume of gas through which sensor beams of radiation travel. An example of a sensor that is sensitive to refractive index variations is an interferometric displacement measuring means employing sensor beams of monochromatic coherent radiation.

An object of the present invention is to provide a lithographic projection apparatus of which a part that is sensitive to temperature deviations, such as the substrate or mask holder or a volume of gas through which beams of radiation travel, is shielded from another part that may cause the temperature sensitive part to deviate from the predetermined temperature.

According to the present invention there is provided a lithographic projection apparatus for imaging a mask pattern in a mask onto a substrate, said apparatus comprising:

- an illumination system constructed and arranged to supply a projection beam of radiation;
- a mask table provided with a mask holder constructed to hold a mask;
- a substrate table provided with a substrate holder constructed to hold a substrate;
- a projection system constructed and arranged to image an irradiated portion of the mask onto a target portion of the substrate;
- a heat shield arranged such that a first part of said apparatus is shielded by said heat shield from a second part, said first part required to have a temperature of a predetermined value, and said second part having a characteristic that may influence said temperature of said first part; and
- heat shield temperature controlling means constructed and arranged to control a temperature of said heat shield to said predetermined value.

In embodiments of the invention the heat shield is arranged such that it is not in thermal contact with the second part. It may be arranged at a distance from said second part and it may at least partly surround said second part. The heat shield temperature controlling means may comprise a conduit arranged in thermal contact with said heat shield and constructed to circulate a fluid, said heat shield temperature controlling means further being constructed and arranged to control a temperature of said fluid to said predetermined value and to circulate said fluid through said conduit.

The characteristic of said second part may be a temperature deviating from said predetermined value, or a supply of radiation that may deviate said temperature of said first part from said predetermined value when incident on said first part. Further, the second part may comprise a power dissipating element, which may be a part of a motor comprised in said apparatus. The motor may, for instance, be constructed and arranged to displace one of said mask table and said substrate table with respect to a frame of said apparatus, or to displace one of said mask holder and said substrate holder with respect to said mask table or said substrate table, respectively.

In a lithographic projection apparatus comprising a base frame and a metrology frame that is mounted substantially vibrationally isolated on said base frame, said metrology frame may be said first part. Said first part may also be a volume of gas in a projection apparatus comprising interferometric displacement measuring means having a beam of monochromatic coherent radiation traveling through the volume of gas of said apparatus.

According to a further aspect of the invention there is provided a method of manufacturing a device using a lithographic projection apparatus comprising:
 an illumination system constructed and arranged to supply a projection beam of radiation;
 a mask table provided with a mask holder constructed to hold a mask;
 a substrate table provided with a substrate holder constructed to hold a substrate; and
 a projection system constructed and arranged to image an irradiated portion of the mask onto a target portion of the substrate, said method comprising the steps of:
  providing a mask bearing a mask pattern to said mask table;
  providing a substrate which is at least partially covered by a layer of radiation-sensitive material to said substrate table;
  arranging a heat shield such that a first part of said apparatus is shielded by said heat shield from a second part, said first part required to have a temperature of a predetermined value, and said second part having a characteristic that may influence said temperature of said first part;
  controlling a temperature of said heat shield to said predetermined value; and
  using the projection beam of radiation and said projection system to project an image of at least a portion of the mask pattern onto a target portion on the substrate.

In a manufacturing process using a lithographic projection, a pattern in a mask is imaged onto a substrate which is at least partially covered by a layer of energy-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Although specific reference has been made hereabove to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

BRIEF DESCRIPTION OF THE DRAWING

The invention and its attendant advantages will be further elucidated with the aid of exemplary Embodiments and the accompanying schematic drawings, in which identical reference numerals indicate identical or like parts, and in which.

DETAILED DESCRIPTION OF THE INVENTION

Embodiment 1

Figure 1:
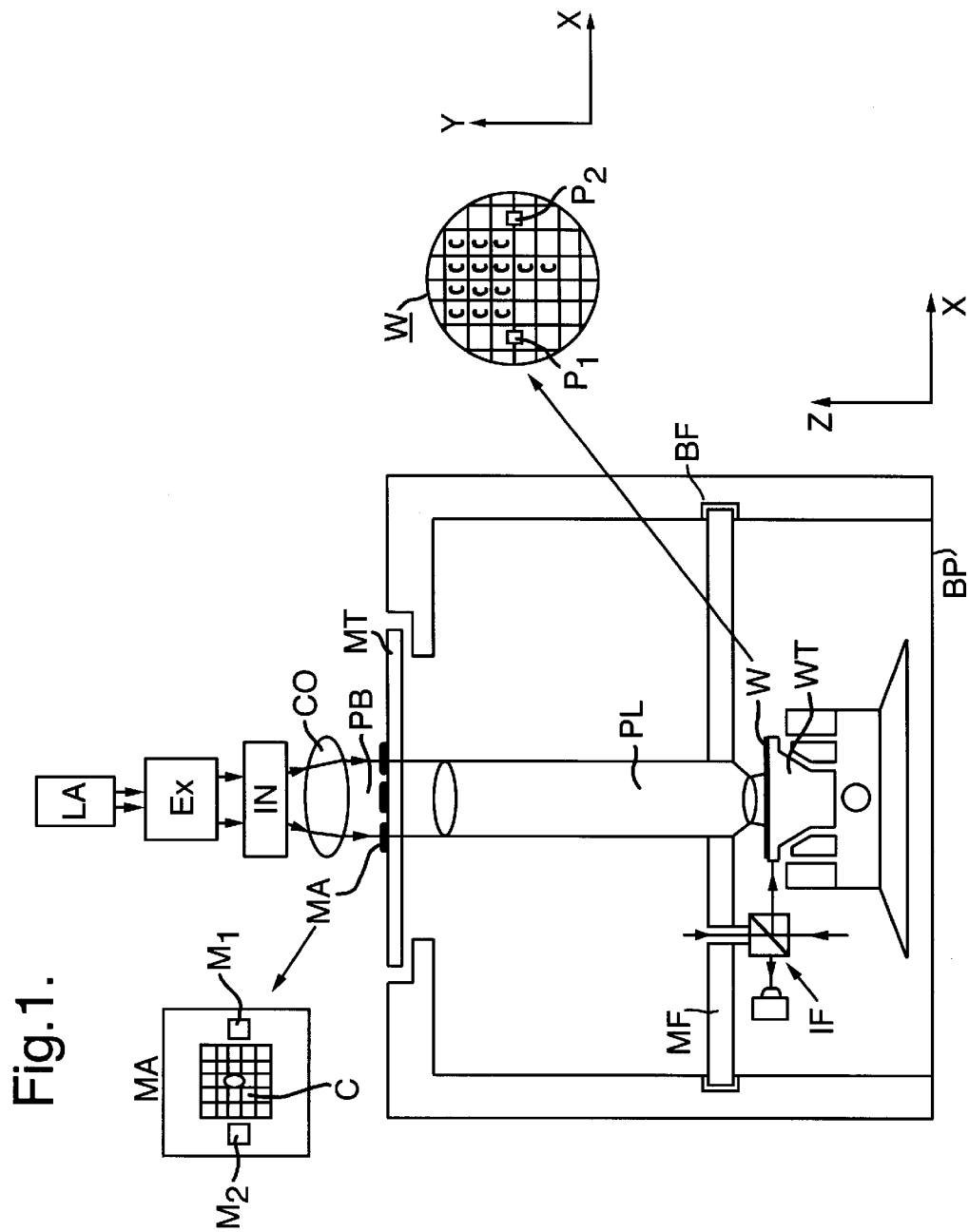
FIG. 1 depicts a lithographic projection apparatus according to an embodiment of the invention.

FIG. 1 schematically depicts a lithographic projection apparatus according to the invention. The apparatus comprises:
 an illumination system LA, Ex, IN, CO for supplying a projection beam PB of radiation (e.g. ultraviolet light with a wavelength of 365 nm, 248 nm, 193 nm or 157 nm, or extreme ultraviolet radiation with a wavelength in the order of 10 nm);
 a mask table MT provided with a mask holder for holding a mask MA (e.g. a reticle);
 a substrate table WT provided with a substrate holder for holding a substrate W (e.g. a resist-coated silicon wafer); and
 a projection system PL (e.g. a lens or catadioptric system, or a mirror group) for imaging an irradiated portion of the mask MA onto a target portion C (comprising one or more dies) of the substrate W.

In the embodiment shown, the depicted apparatus comprises refractive components. However, it may alternatively comprise one or more reflective components. The depicted embodiment also comprises a base frame BF mounted on air mounts (not shown) to substantially isolate it from the environment, and a metrology frame MF that is mounted substantially vibrationally isolated on the base frame to further isolate the metrology frame from its environment. The projection system PL and sensors such as the interferometric displacement measuring means IF are mounted on the metrology frame MF.

The illumination system comprises a radiation source LA which produces a beam of radiation. This beam is caused to traverse various optical components,—e.g. beam shaping optics Ex, an integrator IN and a condenser CO—so that the resultant beam PB has a desired uniformity and intensity distribution in its cross-section.

The beam PB subsequently intercepts the mask MA which is held in a mask holder on a mask table MT. Having traversed the mask MA, the beam PB passes through the projection system PL, which focuses the beam PB onto a target portion C of the substrate W. With the aid of the interferometric displacement measuring means IF, the substrate table WT can be moved accurately, e.g. so as to position different target portions C in the path of the beam PB.

Figure 2:
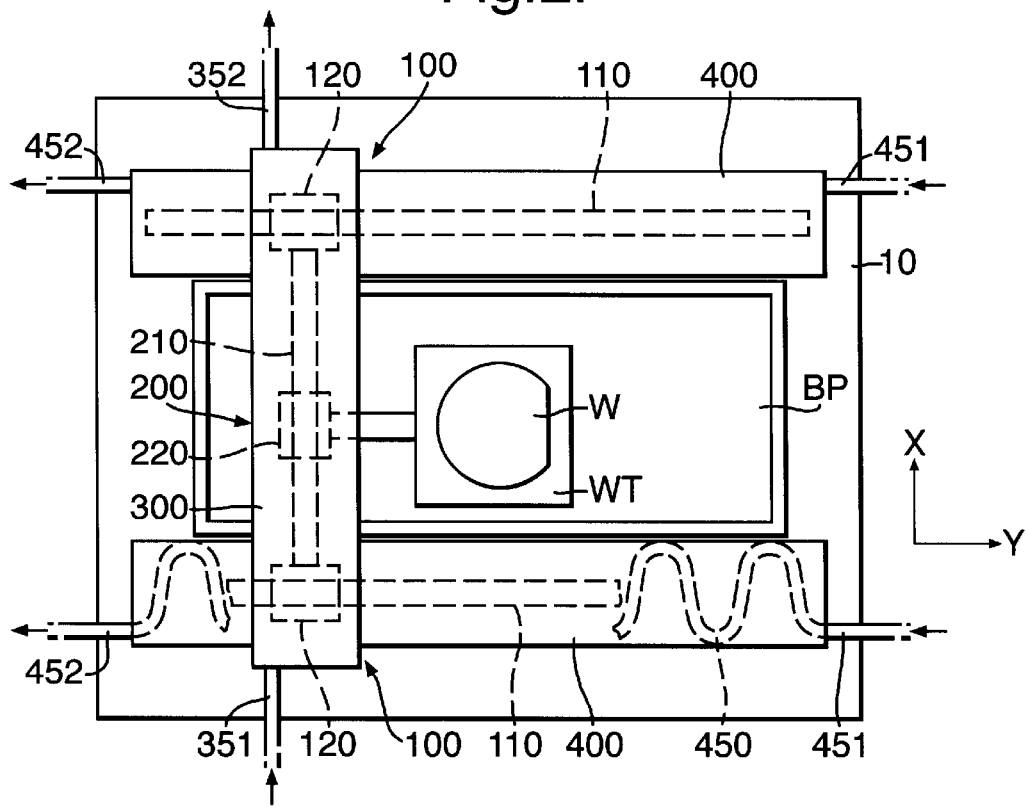
FIG. 2 depicts a plan view of the substrate stage comprising the substrate table and its driving motors.
Figure 4:
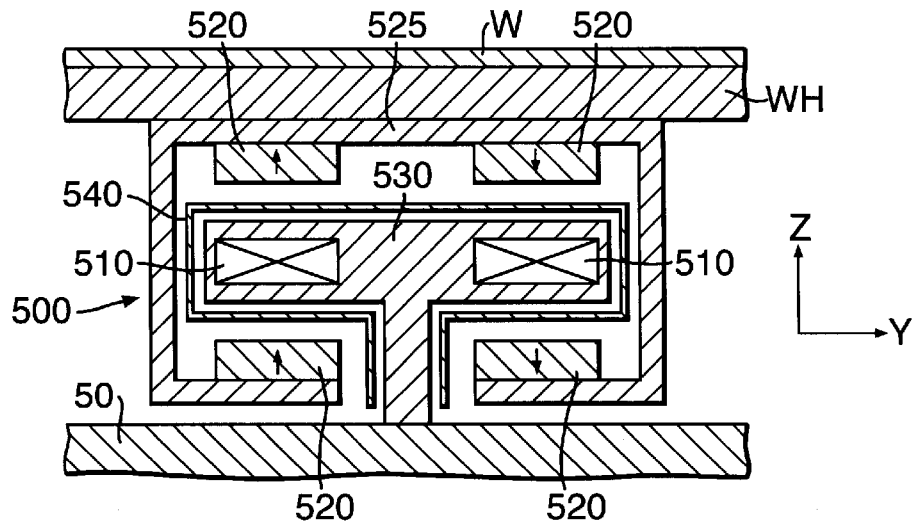
FIG. 4 depicts a part of FIG. 3 in detail, showing the driving configuration of the substrate holder with respect to the substrate table.

The substrate table WT is moved by long stroke motors, shown in FIG. 2, with respect to the base plate BP of the base frame BF, and the substrate holder WH is moved by short stroke motors, shown in FIG. 4, with respect to the substrate table WT for accurate positioning. Similarly, the mask holder MH may be moved by short stroke motors with respect to the mask table MT that may be moved by a long stroke motor with respect to the base frame BF.

The depicted apparatus can be used in two different modes:

1. In step mode, the mask table MT is fixed, and an entire mask image is projected at once (i.e. a single "flash") onto a target portion C. The substrate table WT is then shifted in the x and/or y directions so that a different target portion C can be irradiated by the (stationary) beam PB; and
2. In scan mode, essentially the same scenario applies, except that a given target portion C is not exposed in a single "flash". Instead, the mask table MT is movable in a given direction (the so-called "scan direction", e.g. the x direction) with a speed v, so that the projection beam PB is caused to scan over a mask image; concurrently, the substrate table WT is simultaneously moved in the same or opposite direction at a speed V=Mv, in which M is the magnification of the projection system PL (typically, M=¼ or ⅕). In this manner, a relatively large target portion C can be exposed, without having to compromise on resolution.

FIG. 2 schematically shows a plan view of the wafer stage of the lithographic projection apparatus. The wafer stage comprises the substrate table WT and the base plate BP with a flat, level upper surface over which the substrate table WT can move with essentially no friction since it includes a gas foot (e.g. an air foot) as a support. A known H-drive arrangement consisting of two long stroke linear Y-motors 100 and a long stroke linear X-motor 200, is employed to position the wafer table WT on the base plate BP. The linear Y-motors 100 comprise a Y-beam 110 over which a Y-slider 120 can move. Each end of the X-beam 210 of the X-motor 200 is mounted on a respective Y-slider 120 that can be driven by its linear Y-motor 100 longitudinally of the Y-beam 110. The beams 110, 210 and sliders 120, 220 are shown in phantom lying below a further part 400, 300 to be described hereinafter. The substrate table WT is mounted on the X-slider 220 that can be driven by the X-motor 200 longitudinally of the X-beam 210. The substrate table WT is thus positioned in the X-direction by driving the X-slider 220 along the X-beam 210 and in the Y-direction by driving the Y-sliders 120 along their respective Y-beams 110. Independent control of the Y-sliders 120 will yield a rotation of the substrate table WT about an axis parallel to the Z-direction. The linear Y-motors are mounted on a balance mass 10 that takes the form of a rectangular frame surrounding the base plate BP.

Figure 3:
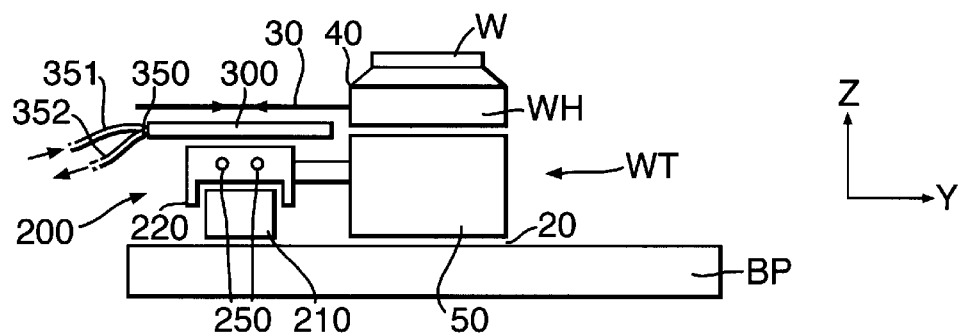
FIG. 3 depicts a cross-section through the substrate table and its motor for driving a displacement in the X-direction.

FIG. 3 shows a cross-section through the substrate table WT and the X-motor 200. It shows the X-slider 220 above the X-beam 210, and the substrate table WT mounted on the X-slider 220. In the embodiment shown, the stator of the linear X-motor is mounted on the X-beam 210 and the X-slider 220 comprises electrical wiring for carrying an electrical current to move the X-slider 220 along the X-beam 210. In an alternative embodiment, the stator is provided on the X-slider 220 and the electrical wiring is provided on the X-beam 210. The electrical wiring and functioning of linear motors is known as such and will not further be described. FIG. 3 also shows the gas foot 20 for supporting the substrate table WT on the base plate BP.

Electrical power will be dissipated in the X-slider 220 when an electrical current is flowing, and the temperature of the X-slider will rise. To control the temperature to a predetermined value, cooling water circulating through a conduit 250 that is incorporated in the X-slider 220 cools the X-slider. In the embodiment shown, the conduit 250 passes through the center of the X-slider 220 along the X-beam 210. Two cross-sections of the conduit 250 is in good thermal contact with the X-slider to the cooling water. However, the temperature may not be controlled very accurately since the temperature of the cooling water will rise upon circulating through the conduit 250 and quite some power may be dissipated in the X-slider 220. A temperature variation of at least some tenths of Kelvins (>0.1K) may therefore exist across the X-slider will be above the predetermined temperature, a net dissipation of heating power, and a part will be below the predetermined temperature, a net dissipation of cooling power.

FIG. 3 further shows a sensor beam 30 of the interferometric displacement measuring means or interferometer IF reflecting from a reflecting side 40 face of the substrate holder WH. The interferometer beam 30 is employed to measure the displacement of the substrate W in the Y-direction. A multiple of interferometer beams reflecting from different locations on the side face shown may be employed to be able to measure a rotation and/or tilt of the substrate. A multiple of interferometer beams reflecting from a side face of the substrate holder positioned along the Y-direction and from a backwards inclined part of the reflecting side face 40 may be employed to measure a displacement in the X-direction and Z-direction, respectively, and another tilt. For convenience purposes only one interferometer beam 30 is shown.

A variation in optical path length of the measurement beam 30 shown with respect to a reference beam (not shown) is measured with the interferometer IF. Ideally, the optical path length only changes when the substrate holder WH is displaced. However, the optical path length may also show variations due to variations in the refractive index in the medium, such as a gas, through which the interferometer beams travel. These variations in the refractive index may be caused by turbulences and temperature variations in said gas. To reduce these to a minimum the several parts of the apparatus are controlled to the well-defined, predetermined temperature and also air showers (not shown) may be employed to control the temperature and turbulence of the gas the interferometer beam travels through. Temperature control and air showers may also be employed for other reasons than discussed above.

A temperature variation in the X-slider 220 may cause temperature variations and turbulences in the gas the measurement beam 30 travels through, limiting the positioning accuracy of the substrate holder WH and substrate W. To further control temperature variations and turbulences, a heat shield 300 is arranged at a small distance above the X-slider 220 such that they are not in thermal contact. The heat shield is controlled very accurately to the predetermined temperature of the apparatus. A temperature control to within millikelvin range around the predetermined temperature may be achieved. To this end the heat shield 300 is provided with a conduit 350 for circulating a cooling fluid, for instance water, that may be controlled to the predetermined temperature to within the millikelvin variational range by a temperature controller (not shown). The conduit 350 is, in the embodiment shown, arranged in between upper and lower plates of the heat shield 300 in a very good thermal contact with both plates for an efficient heat transfer from the heat shield 300 to the cooling fluid, and vice versa. Further, the heat shield 300 is made of a material having a very high thermal conductivity, such as aluminum or an aluminum alloy, to very efficiently conduct the heat to its conduit 350.

The heat load on the heat shield 300 will be rather limited since the X-slider 220 is already controlled to a temperature within a limited range of the predetermined temperature and the distance in between the X-slider and the heat shield 300 provides a very large heat resistance. A limited heat load and a very efficient temperature regulation will yield a temperature to within a narrow temperature range (in the order of millikelvins) of the predetermined temperature. The heat shield 300 may therefore be regarded as a sort of thermal ground, an equivalent to an electrical ground potential.

The heat shield 300 is not just arranged above the X-slider 220, but is arranged above the X-beam 210 over the entire length thereof, such that the X-slider 220 can move underneath the heat shield 300. An elevated temperature of the X-slider 220 may heat the X-beam 210, leading to an elevated temperature thereof, which may also lead to the above-mentioned disturbances in the absence of the heat shield when the X-slider 220 has moved to another location. The heat shield 300 will, in the embodiment shown, also prevent disturbances caused by such a temperature of the X-beam 210, which deviates from the predetermined value.

FIG. 2 shows that heat shields 400 are also provided above the Y-beams 110. The linear Y-motors 100 and their respective heat shields 400 are configured as described for the linear X-motor. The bottom part of FIG. 2 shows in phantom the cooling conduit 450 meandering in between the upper and lower plates of the heat shield 400 from a supply connection 451 to an exhaust connection 452. Supply and exhaust connections 351 and 352 are also shown for the cooling conduit 350 of the heat shield 300.

Heat shields 300, 400 are only disposed above the beams 110, 210 and sliders 120, 220 of the linear motors 100, 200 since parts of the apparatus being extremely sensitive to temperature variations are situated above the heat shields 300, 400. If required, the heat shields 300, 400 may also enclose the beams 110, 210 on more sides.

Embodiment 2

A further embodiment of the invention is shown in FIG. 4. It partly shows a cross-section through the substrate table WT and its substrate holder WH on which a substrate W is present. The substrate holder, and thus the substrate, can be displaced with respect to a base part 50 of the substrate table by short stroke motors that take the form of a so-called Lorentz-force motor in the embodiment shown. The Lorentz-force motor 500 shown comprises a plurality of electrical windings 510 parallel to a plane that is perpendicular to the plane of the drawing, and two sets of permanent magnets 520 of which the north-south directions are oriented as indicated by arrows. Magnets 520 are mounted on a yoke 525 that is mounted on the substrate holder WH. Part of a winding passes in between the two magnets of a first set and part of a winding passes in between the two magnets of another set. An electrical current flowing through the windings or coil 510 will induce a force parallel to the plane of the drawing and displacing the substrate holder WH with respect to the base part 50 of the substrate table WT. Three Lorentz-force motors (not shown) are provided in the substrate table.

Electrical power will be dissipated in the windings 510 when an electrical current is flowing, causing a rise in temperature of the coil 510 of the Lorentz-force motor 500. The temperature may be controlled to a predetermined value by cooling a member 530 in which the windings are enclosed by cooling water circulating through conduits (not shown) incorporated in said member. Still a temperature variation across the part 530 of the Lorentz-force motor comprising the windings may exist, as is described for the X-slider of embodiment 1. Such a temperature variation may cause the temperature of the substrate holder WH to vary with respect to a predetermined temperature. This may lead to expansion and/or contraction of the substrate holder WH and substrate W, causing an inaccuracy in the positioning of the substrate and thus of the die to be irradiated, which, in turn, will cause overlay errors.

To further reduce the thermal load on the substrate holder WH, a heat shield 540 is arranged substantially around and at a distance from the part 530 carrying the electrical windings. As in the first embodiment, the heat shield 540 is made of a material having a very high thermal conductivity. The heat shield 540 should, however, not act as a magnetic shield in the present embodiment. A conduit may also be incorporated in the heat shield 540 for circulating a cooling fluid to accurately control its temperature. Such a conduit is not shown in FIG. 4, but is like the one in the heat shields 300, 400 described for embodiment 1.

Figure 5:
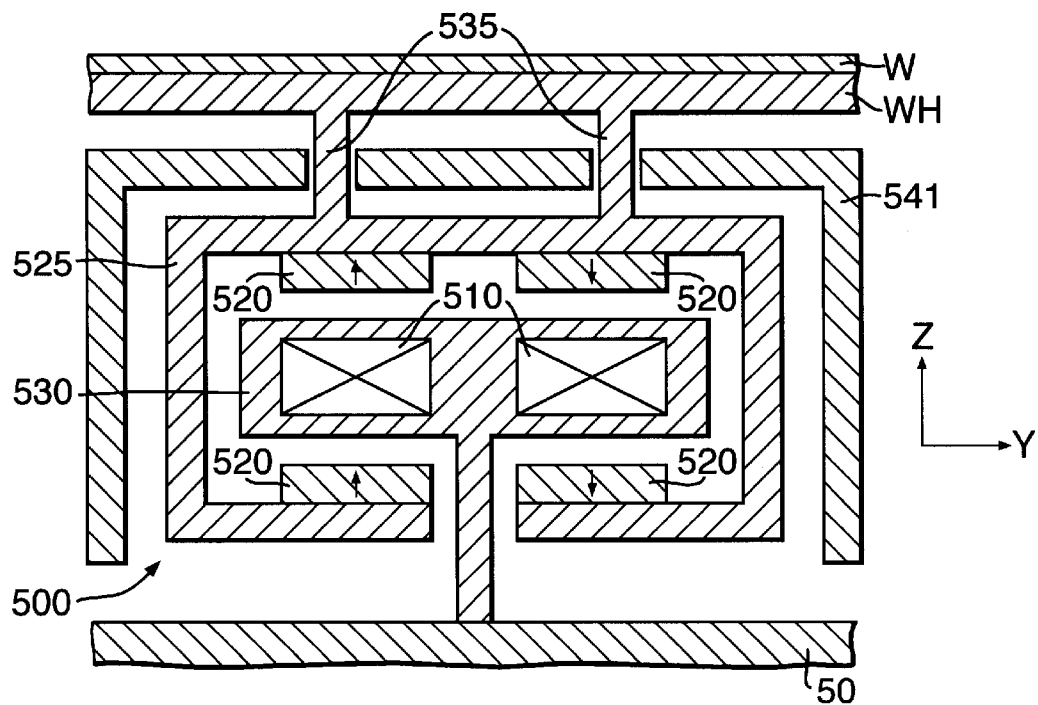
FIG. 5 depicts an alternative part of FIG. 3 in detail, showing the driving configuration of the substrate holder with respect to the substrate table.

An alternative to the embodiment shown in FIG. 4 is depicted in FIG. 5. In this embodiment—which is identical to the previous embodiment save as described in the following—a heat shield 541 is located between the Lorentz-force motor 500 and the substrate holder WH. The heat shield is arranged substantially around motor 500 and at a distance from both the Lorentz-force motor 500 and substrate holder WH. The yoke 525 which is part of the Lorentz-force motor 500 is connected to the substrate holder via connection 535.

Embodiment 3

Figure 6:
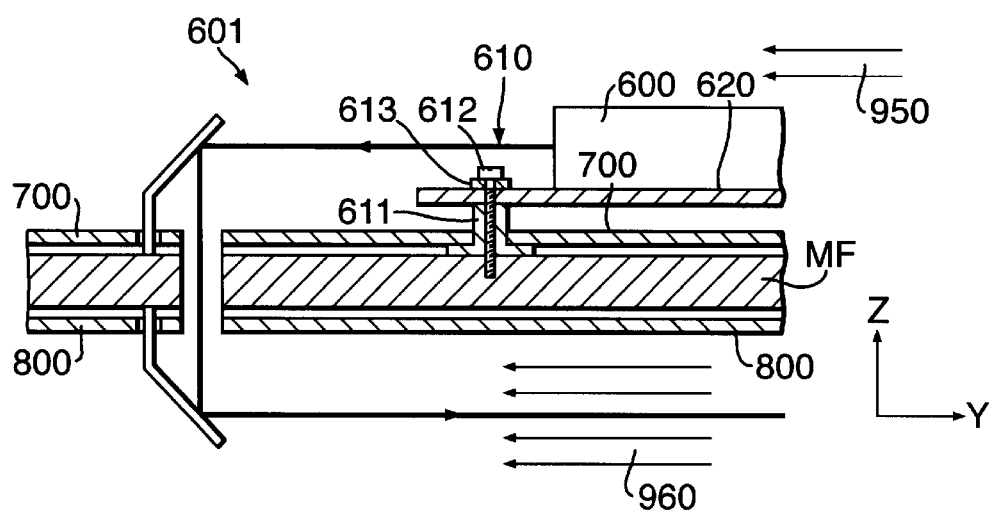
FIG. 6 depicts a cross-section through a part of the metrology frame.

FIG. 6 shows a laser unit 600 of the interferometer IF mounted on the top side of the metrology frame MF in a third embodiment. The unit 600 is mounted on the metrology frame because of stability considerations, and contains a laser (not shown) that will dissipate power and therefore acquires an elevated temperature. An airflow 950 is directed over the unit for cooling, but still its temperature may deviate from a value predetermined for the temperature of the metrology frame MF. To shield the metrology frame from the unit 600, a heat shield 700 is positioned in between the unit 600 and the metrology frame MF. The heat shield 700 is also mounted on the connection 610, which will then be mainly held at the temperature of the heat shield 700, to prevent heat from flowing from unit 600 to frame MF via the connection 610. Temperature controlling means (not shown) will control the heat shield 700 to a predetermined temperature. Connection 610 comprises a bush 611 arranged in between plate 620 of unit 600 and frame MF and to which the heat shield 700 is connected, and further comprises a bolt 612 for securing plate 620 of unit 600 to the bush 611. Bolt 612 is screwed into the metrology frame MF and a washer 613 having a very low thermal conductivity is arranged in between bolt 612 and plate 620 to prevent heat from flowing directly via bolt 612 to the frame MF.

Laser beam 601 deriving from the laser unit 600 is directed to below the metrology frame, and subsequently directed towards a measuring mirror mounted on the substrate table WT and towards a reference mirror (not shown) mounted on the metrology frame. As described for the first embodiment, the laser beams should travel through a medium having an identical temperature in the measuring and reference branch. Since the temperature of the metrology frame may deviate to some extent from a predetermined value due to a power dissipating element that is mounted directly onto it, another heat shield 800 is provided at the bottom side of the metrology frame MF. Heat shield 800 is temperature controlled to a temperature having a well-defined predetermined value by temperature controlling means that are discussed with respect to embodiment 1 and which are not shown in FIG. 6. It presents a predetermined temperature to the medium through which the interferometer laser beams travel, such as an air flow 960 of which the temperature is also controlled. Since the air flow 960 may travel over a certain distance along the metrology frame, the heat shield 800 extends over at least a range along the metrology frame that corresponds to the air flow 960 flowing along the frame MF.

It is also shown in FIG. 6 that heat shield 700 extends over a larger range along the metrology frame MF than the extension of the plate 620 of the laser unit 600, which is to shield the metrology frame MF from other sources (not shown) that may heat the frame MF. Those sources may have a temperature deviating from the predetermined value and heat the frame MF by thermal radiation or air convection, but may also heat the frame MF by a supply of radiation, such as from the projection beam of radiation, that will heat the metrology frame when absorbed by the frame MF. Projection radiation may be incident on the metrology frame when reflected towards the metrology frame by parts of the apparatus. Both heat shields 700, 800 will thus shield the metrology frame from sources that may heat the metrology frame MF, as well as it will shield parts of the apparatus that may be influenced by the metrology frame MF not having the predetermined temperature. The air flow 960 through which the interferometer beams travel may not be heated directly by radiation, but might be heated by a surface of the metrology frame MF that has absorbed those radiation.

Heat shields 700, 800 having a predetermined temperature enclose the metrology frame MF. Consequently, the metrology frame will obtain the temperature of the heat shields 700, 800, and in this way be temperature controlled.

The heat shields may be mounted directly to the metrology frame as is shown by connection 610 for heat shield 700, but may also be mounted on the base frame BF.

While specific embodiments of the invention are disclosed above it will be appreciated that the invention may be practiced other than described. The description is not intended to limit the invention.

Although this text has concentrated on lithographic apparatus and methods whereby a mask is used to pattern the radiation beam entering the projection system, it should be noted that the invention presented here should be seen in the broader context of lithographic apparatus and methods employing generic "patterning means" to pattern the said radiation beam. The term "patterning means" as here employed refers broadly to means "or mask" that can be used to endow an incoming radiation beam with a patterned cross-section, corresponding to a pattern that is to be created in a target portion of the substrate; the term "light valve" has also been used in this context. Generally, the said pattern will correspond to a particular functional layer in a device being created in the target portion, such as an integrated circuit or other device. Besides a mask on a mask table, such patterning means include the following exemplary embodiments:

A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-adressable surface. The required matrix addressing can be performed using suitable electronic means. More information on such mirror arrays can be gleaned, for example, from U.S. Pat. Nos. 5,296,891 and 5,523,193, which are incorporated herein by reference.

A programmable LCD array. An example of such a construction is given in U.S. Pat. No. 5,229,872, which is incorporated herein by reference.

What is claimed is:

1. A lithographic projection apparatus for imaging of a mask pattern in a mask onto a substrate, said apparatus comprising:

an illumination system constructed and arranged to supply a projection beam of radiation;

a mask table provided with a mask holder constructed to hold a mask;

a substrate table provided with a substrate holder constructed to hold a substrate;

a projection system constructed and arranged to image a portion of the mask that is to be irradiated by the projection beam onto a target portion of the substrate;

a heat shield arranged such that a first part of said apparatus is shielded by said heat shield from a second part, said first part being at a desired temperature, and said second part having a characteristic that influences said temperature of said first part; and a heat shield temperature controller constructed and arranged to control a temperature of said heat shield to said desired temperature, wherein said heat shield at least partly surrounds said second part.

2. A lithographic projection apparatus according to claim 1,
wherein said heat shield is arranged such that it is not in thermal contact with said second part.

3. A lithographic projection apparatus according to claim 2, wherein said heat shield is arranged at a distance from said second part.

4. A lithographic projection apparatus according to claim 1,
wherein said heat shield temperature controller comprises a conduit arranged in thermal contact with said heat shield and constructed to circulate a fluid, said heat shield temperature controller further being constructed and arranged to control a temperature of said fluid to said desired temperature and to circulate said fluid through said conduit.

5. A lithographic projection apparatus according to claim 1,
wherein said heat shield comprises a material having a high thermal conductivity.

6. A lithographic projection apparatus according to claim 1,
wherein said characteristic of said second part is a temperature deviating from said desired temperature.

7. A lithographic projection apparatus according to claim 6, wherein said second part comprises a further temperature controller constructed and arranged to control a temperature of said second part.

8. A lithographic projection apparatus according to claim 6,
wherein said second part comprises a power dissipating element.

9. A lithographic projection apparatus according to claim 8, wherein said apparatus comprises a motor and a part of said motor is said power dissipating element.

10. A lithographic projection apparatus according to claim 9, wherein said motor is a motor constructed and arranged to displace one of said mask table and said substrate table with respect to a frame of said apparatus.

11. A lithographic projection apparatus according to claim 10, wherein said motor is a linear motor having a range of linear displacement, and said heat shield covers said linear motor over said range.

12. A lithographic projection apparatus according to claim 9, wherein said motor is a motor constructed and arranged to displace one of said mask holder and said substrate holder with respect to said mask table or said substrate table, respectively.

13. A lithographic projection apparatus according to claim 1,
wherein said characteristic of said second part is a supply of radiation that may deviate said temperature of said first part from said desired temperature when incident on said first part.

14. A lithographic projection apparatus according to claim 1,
wherein said apparatus comprises a base frame and a metrology frame that is mounted substantially vibrationally isolated on said base frame, and said metrology frame comprises said first part.

15. A lithographic projection apparatus according to claim 1,
wherein said apparatus comprises an interferometer having a beam of monochromatic coherent radiation traveling through a volume of gas of said apparatus, and wherein said volume of gas is said first part.

16. A method of manufacturing a device comprising:
providing a mask bearing a mask pattern to a mask table of a lithographic projection apparatus;
providing a substrate which is at least partially covered by a layer of radiation-sensitive material to a substrate table;
thermally shielding with a heat shield a first part of said apparatus from a second part, wherein said first part being at a desired temperature, said second part has a characteristic that influences said temperature of said first part, and said heat shield at least partly surrounds said second part;
controlling a temperature of said heat shield to said desired temperature; and
using a projection beam of radiation to project an image of at least a portion of the mask pattern onto a target portion on the substrate.

17. A device manufactured according to the method of claim 16.

18. A lithographic projection apparatus for imaging of a mask pattern in a mask onto a substrate, said apparatus comprising:
an illumination system constructed and arranged to supply a projection beam of radiation;
a mask table provided with a mask holder constructed to hold a mask;
a substrate table provided with a substrate holder constructed to hold a substrate;
a projection system constructed and arranged to image a portion of the mask that is to be irradiated by the projection beam onto a target portion of the substrate;
a heat shield arranged such that a first part of said apparatus is shielded by said heat shield from a second part, said first part being at a desired temperature, and said second part having a characteristic that influences said temperature of said first part; and
a heat shield temperature controller constructed and arranged to control a temperature of said heat shield to said desired temperature,
wherein said characteristic of said second part is a temperature deviating from said desired temperature, said second part comprises a power dissipating element, and
wherein said power dissipating element is a part of a motor, said motor is constructed and arranged to displace one of said mask table and said substrate table with respect to a frame of said apparatus, and said motor is a linear motor having a range of linear displacement, and said heat shield covers said linear motor over said range.

19. A lithographic projection apparatus for imaging of a mask pattern in a mask onto a substrate, said apparatus comprising:
an illumination system constructed and arranged to supply a projection beam of radiation;
a mask table provided with a mask holder constructed to hold a mask;
a substrate table provided with a substrate holder constructed to hold a substrate;
a projection system constructed and arranged to image a portion of the mask that is to be irradiated by the projection beam onto a target portion of the substrate;

a motor constructed and arranged to displace at least one of said mask table and said substrate table with respect to a frame of said apparatus;

a heat shield arranged such that at least one of said mask table and said substrate table is shielded by said heat shield from said motor, said at least one of said mask table and said substrate table being at a desired temperature, and said motor being a heat source that influences said temperature of said at least one of said mask table and said substrate table; and a heat shield temperature controller constructed and arranged to control a temperature of said heat shield to said desired temperature.

20. A lithographic projection apparatus according to claim 19, wherein said heat shield at least partly surrounds said motor.

* * * * *